United States Patent
Clevenger et al.

(10) Patent No.: US 6,870,263 B1
(45) Date of Patent: Mar. 22, 2005

(54) DEVICE INTERCONNECTION

(75) Inventors: Lawrence A. Clevenger, Lagrangeville, NY (US); Ronald G. Filippi, Wappingers Falls, NY (US); Mark Hoinkis, Fishkill, NY (US); Jeffery L. Hurd, Marlboro, NY (US); Roy C. Iggulden, Newburgh, NY (US); Herbert Palm, Hoehenkirchen-Siegertsbrunn (DE); Hans W. Poetzlberger, Munich (DE); Kenneth P. Rodbell, Poughquag, NY (US); Florian Schnabel, Wappingers Falls, NY (US); Stefan Weber, Fishkill, NY (US); Ebrahim A. Mehter, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/052,688

(22) Filed: Mar. 31, 1998

(51) Int. Cl.[7] ............................................. H01L 23/48
(52) U.S. Cl. ..................................... 257/750; 257/767
(58) Field of Search ........................ 257/740, 750–753, 257/764, 767

(56) References Cited

U.S. PATENT DOCUMENTS 5,397,744 A * 3/1995 Sumi et al. .................. 438/643
5,693,563 A * 12/1997 Teong ......................... 438/627
5,990,011 A * 11/1999 McTeer ....................... 438/692
6,136,682 A * 10/2000 Hegde et al. ........... 204/192.15

FOREIGN PATENT DOCUMENTS

JP  4-267359  * 9/1992

OTHER PUBLICATIONS

Toyoda, H. et al.; "Improvement in the Electromigration Lifetime Using Hyper–Textured Aluminum Formed on Amorphous Tantalum–Aluminum Underlayer"; 32$^{nd}$ Annual Proceedings Reliability Physics Symposium, Apr. 11–14, 1994. IEEE International, pp. 178–184.*

* cited by examiner

Primary Examiner—Long Pham
Assistant Examiner—Ginette Peralta
(74) Attorney, Agent, or Firm—Slater & Matsil, L.L.

(57) ABSTRACT

A conductor for interconnecting integrated circuit components having improved reliability. The conductor includes a liner surrounding at least three surfaces of the conductor, producing a low textured conductor. It has been found that low textured conductor results in improved electromigration lifetime.

17 Claims, 4 Drawing Sheets

DEVICE INTERCONNECTION

FIELD OF THE INVENTION

The invention relates to semiconductor fabrication in general and, more particularly, to providing reliable device interconnections.

BACKGROUND OF THE INVENTION

In device fabrication, insulating, semiconducting, and conducting layers are formed on a substrate. The layers are patterned to create features and spaces. The minimum dimension or feature size (F) of the features and spaces depends on the resolution capability of the lithographic systems. The features and spaces are patterned so as to form devices, such as transistors, capacitors, and resistors. These devices are then interconnected to achieve a desired electrical function, creating an integrated circuit (IC).

One technique for interconnecting the devices includes depositing a layer of metallic or conductive material, such as aluminum (Al), tungsten (W), or copper (Cu), on a substrate comprising devices and patterning it to form conductors or "lines" that interconnect the devices as desired. Conventional lithographic and etch techniques are used to pattern the conductive layer. Such techniques, for example, deposit a layer of resist and selectively expose the resist with an exposure source and a mask. Depending on whether a positive or negative resist is used, either the exposed or unexposed portions of the resist layer are removed during development. The portions of the underlying metal layer unprotected by the resist are removed, creating the desired metal interconnections lines. Such techniques for forming lines or conductors are referred to as RIE techniques.

An important aspect of forming metal lines is their reliability; that is, the line's time to failure for a given amperage per unit area. Considerable efforts have been made to improve the reliability of conductive lines. Conventionally, it is known that depositing the conductive material such that it has a uniform (111) grain orientation improves the film's reliability. See for example, L. M. Ting and Q-Z. Hong, "Electromigration Characterization for Multilevel Metallizations using Textured AlCu", Materials Research Society Symposium Proceedings, Vol 428, pp. 75–80 (1996), D. B. Knorr and K. P. Rodbell, "The Role of Texture in the Electromigration Behavior of Pure Aluminum Lines", J. Appl. Phys. Vol. 79, pp.2409–2417 (1996), C. Ryu, A. L. Loke, T. Nogami and S. S. Wong, "Effect of Texture on the Electromigration of CVD Copper", IEEE International Reliability Physics Symposium 97CH35983, pp.201–205 (1997).

In advanced IC designs, damascene or dual damascene techniques have been used to form sub-micron conductive lines. The damascene technique includes, for example, first etching submicron trenches in a dielectric material, such as $SiO_2$. Subsequently, the trenches are filled with a conductive material. Typically, Al, Cu, or W is used to fill the trenches. The excess conductive material is removed from the surface above the insulator by chemical-mechanical polishing (CMP). In the dual damascene approach, both trenches and vias are etched in the dielectric material. The vias and trenches are then filled with a conductive material and planarized with CMP, producing a planar surface with conductive lines and vias embedded in the dielectric material.

It has, however, been discovered that as dimensions decrease, increased failures have been found with conventional damascene lines formed with textured materials.

From the above discussion, it is desirable to provide interconnects formed from damascene structures that have improved reliability.

SUMMARY OF THE INVENTION

The invention provides an interconnection in ICs having improved reliability. In one embodiment, improved electromigration lifetime of interconnections formed from damascene structures is achieved by decreasing the texture of the conductive material used to form the interconnections. A liner is used to surround or encapsulate the conductor to impart a random grain orientation of the conductive material. Increased random grain orientation or decreased texture, contrary to current teachings, increases the electromigration lifetime of the conductor.

DETAILED DESCRIPTION OF THE INVENTION

The invention relates to conductors that interconnect devices in integrated circuits (ICs). Such ICs include random access memories (RAMs), dynamic random access memories (DRAMs), asynchronous DRAMs (SDRAMs), and read only memories (ROMs). Other ICs that include application specific integrated circuits (ASICs) or any logic circuit. Typically, a plurality of ICs are formed on the wafer in parallel. After processing is finished, the wafer is diced to separate the ICs into individual chips. The chips are then packaged, resulting in a final product that is used in, for example, consumer products such as computer systems, cellular phones, personal digital assistants (PDAs), and other electronic products.

More particularly, the invention relates generally to damascene structures that are used to form interconnections in the fabrication of integrated circuits (ICs). Such damascene structures include, for example, a single layer damascene structure in which only a single metal line is formed (no vias), a multilayer damascene structure with a combination of lines and/or vias, or a slotted damascene structure in which the via level of a damascene structure is used as a conducting wire.

Figure 1A:
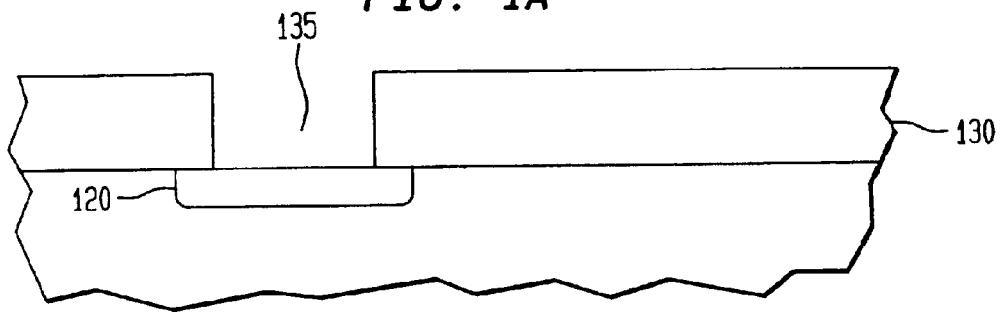
FIGS. 1a–1j show an illustrative embodiment of the invention.

Referring to FIG. 1a, a cross sectional view of an integrated circuit structure 100 is shown. As shown, the structure comprises a substrate 101, such as a silicon wafer. Other semiconductor substrates such as gallium arsenide, germanium, silicon on insulator (SOI), or other semiconductor materials are also useful. The substrate, for example, may be lightly or heavily doped with dopants to achieve the desired electrical characteristics.

The substrate includes features 110 (not shown in detail) formed in and/or on the substrate. The features correspond to devices that form an IC. Included on the IC is a previously defined device layer 120 wherein contact with another conductive layer is desired. Although the device layer, for purposes of illustration, is depicted as being spatially above the features, it is understood that it may be located within the same layer. Device layer 120, for example, represents a portion of an underlying metallization layer. Alternatively, the device layer is a highly doped silicon, polysilicon layer, or a portion of any type of an active device such as, for example, the source or drain region of a transistor. In one embodiment, device layer 120 represents a bitline of a DRAM IC.

An insulator layer 130 is formed over the substrate, covering the device features and device layer. The insulator layer serves, for example, as an interlevel dielectric that isolates the device features from a conductive layer. The insulator layer comprises a dielectric material such as silicon oxide ($SiO_2$) formed from tetra-ethyl-ortho-silicate (TEOS). Other materials such as doped silicate glass including phosphosilicate glass (PSG), borosilicate glass (BSG), or borophoshosilcate glass (BPSG). Other insulator material also includes, for example, a polymer like polyimide. The insulator layer can be deposited by, for example, chemical vapor deposition (CVD) or other deposition techniques.

In the illustrative embodiment, the insulator layer is patterned to form an opening 135 therein. Patterning is achieved using conventional lithogrpahic and etch techniques. Such techniques include depositing a photoresist layer and selectively exposing it with an exposure source using a mask. Depending on whether a positive or negative resist is used, the exposed or unexposed portions of the resist are removed during development. After development, the portion of the resist remaining serves as an etch mask, protecting the dielectric layer outside of the contact opening region from being etched. An anisotropic etch, such as a RIE, removes the unprotected portion of the dielectric layer, creating contact opening 135.

The opening is aligned with the device layer 120, exposing it. The thickness of the insulator layer is sufficient to form the contact hole. The thickness of the insulator layer is equal to about the height of the contact hole. Typically, the thickness of the insulator layer is about 2000–10000 Å. Of course, the thickness depends on design requirements and may vary accordingly.

It has been discovered that filling contact openings and damascene or trench structures with a conductive material having a random grain orientation or less texture improves the electromigration reliability of interconnects. This is in contrast to what is currently known or expected in the art. See, for example, Ting et al., Mat Res. Symp. Proc. Vol 428, p. 75 (1996), which is herein incorporated by reference for all purposes. Ting teaches that there is correlation between a strong texture and improved electromigration in RIE metallurgy.

Crystollagrahic texture or texture is determined by two film components, the film's fiber and volume fraction of random grains. The films fiber is based on the film's orientation. A stongly fiber textured or orientated film has substantially all surface normal vectors of the film's individual grains pointing in a direction normal to the film's surface. A random grain orientated film has the surface normal vectors of its individual grains pointing in a variety of different directions. Take, for example, a film whose orientation is based primarily on the (111) plane, such as Al or Cu. In such instances, a strongly fiber textured or orientated film would have the surface normal (111) vectors of its individual grains orientated normal to the film surface. A random grain orientated film would mean that surface normal (111) vectors of the film's individual grains are pointing in a variety of different directions.

Figure 1B:
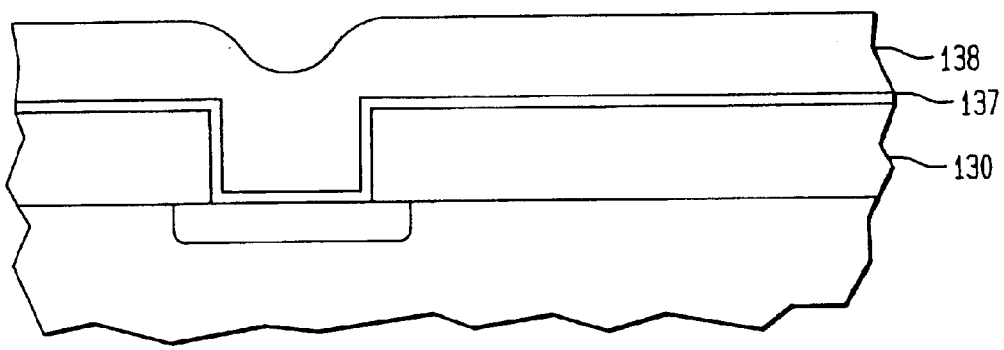

Referring to FIG. 1b, a layer 137 is deposited over the insulator layer 130. The layer, which lines the walls and bottom of the contract opening, functions as an underlayer or liner for a conductive layer 138 that is subsequently deposited to fill the contact opening. In accordance with the invention, the layer imparts an enhanced grain-orientation randomness in the material that fills the damascene structure. In one embodiment, the layer comprises a material with low-oriented grains and/or amorphous character.

In one embodiment, the underlayer comprises titanium nitride (TiN). The use of Ta or Ta/N is also useful. The TiN layer is deposited by, for example, chemical vapor deposition (CVD). The parameters used to deposit the TiN layer by CVD are chosen to enhance the grain orientation randomness and/or amorphous character of the underlayer. In one embodiment, the under layer comprises about 50 Å of $N_2/H_2$ plasma treated TiN. Deposition of TiN having enhanced grain orientation randomness and/or amorphous character is described in, for example, D. P. Tracy, D. B. Knorr and K. P. Rodbell, J. Appl. Phys. Vol. 76, p.2671 (1994), which is herein incorporated by reference for all purposes. Other techniques for depositing the TiN layer with enhanced grain orientation randomness and/or amorphous character, such as physical vapor deposition (PVD) for example, are also useful. Such techniques are described in, for example, K. F. Lai, et al., 1997 VMIC, which is also herein incorporated by reference for all purposes. Alternatively, the underlayer comprises refractory materials or other materials such as carbon, graphite, noble and near noble metals, rare earth metals, or other materials which have a random grain orientation and/or amorphous character.

The thickness of the liner is sufficient to effect a random grain orientation in the subsequently deposited conductor material to increase its electromigration lifetime. As is known, the liner material typically increases the sheet resistance of the conductor. Thus, the thickness of the liner should be at or below a thickness which would cause the contact to exceed a specified sheet resistance. The specified sheet resistance depends on design requirements. For TiN liners, the thickness is about 5–1000 Å, and preferably about 10–1000 Å. The thickness may be optimized for specific applications.

A subliner layer (not shown) may be formed prior to the formation of the liner layer 137. This subliner layer serves as, for example, an adhesion layer which improves the contact resistance between layers and to provide a template for the subsequently deposited layer 137 to nucleate and grow. In one embodiment, the subliner layer comprises, for example, titanium (Ti). Various techniques for depositing the Ti layer, such as CVD, PVD and I-PVD are useful. The thickness of the Ti layer is typically about 1–30 nm.

The conductive layer 138 is deposited after the formation of the underlying layer 137. The conductive layer, for example, comprises Al, Cu, or W. Other conductive materials are also useful. Typically, the conductive layer is deposited by conventional techniques. Such techniques include, for example, CVD, PVD and I-PVD. Other techniques, such as sputtered deposition, sputtered deposition at high temperature (with respect to the melting point of the metal considered) during which the metal reflows to fill the damascene structure, post-deposition high-pressure/high temperature treatment, and dep-etch-dep, which may be sequentially performed in more than one chamber, or by using different recipe steps in one chamber, or as a result of a regular, high frequency component that is a constituent of the deposition process, or other deposition techniques, are also useful. Additionally, the conductive layer can be deposited by a combination of above mentioned techniques. To ensure that the conductive material fills the damascene structure, an overfill is typically employed.

Figure 1C:
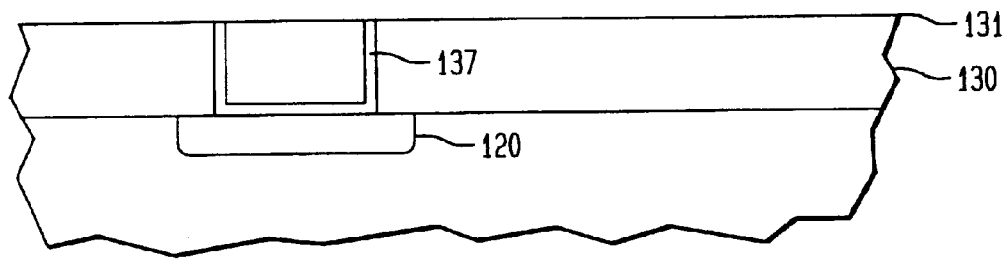

Referring to FIG. 1c, excess material from the liner 137 and conductor 138 are then polished away. The polish, for example, is a chemical mechanical polish (CMP) which uses the dielectric layer 130 as a polish stop. The liner and conductor materials are removed from the surface of the dielectric layer, creating a planar surface 131 for additional layers. As a result, a contact is formed, electrically coupled to the device layer 120.

As shown, a contact having its sidewalls and bottom lined with a liner is provided. The liner causes the conductive material in the contact to have a random grain orientation to improve electomigration lifetime.

Figure 1D:
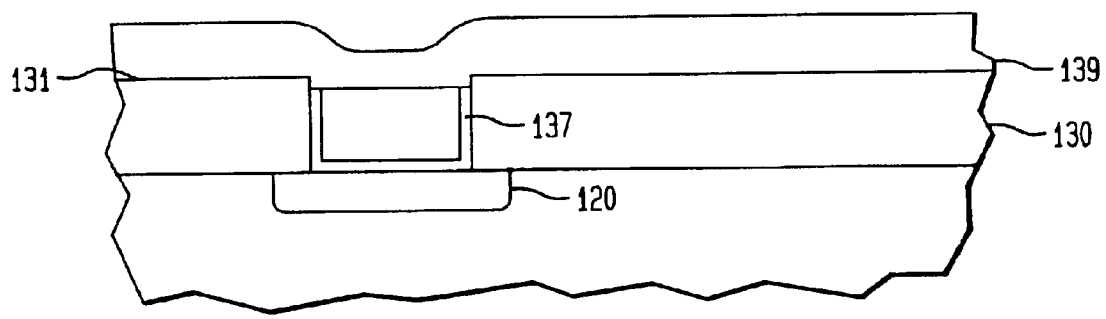
Figure 1E:
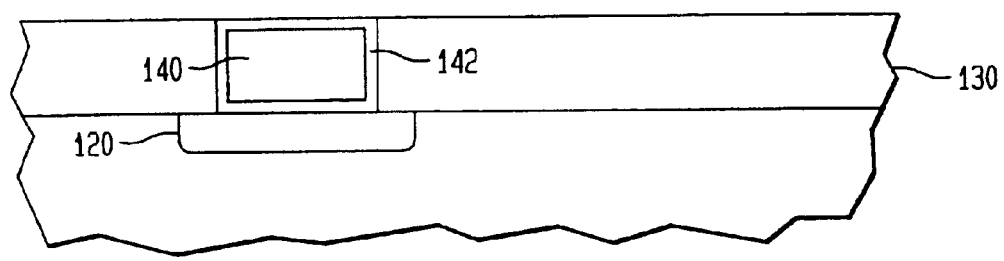

In an alternative embodiment, further grain orientation randomness can be achieved by encapsulating the contact with the liner. Referring to FIG. 1d, an etch such as a CMP metal overpolish, is employed to further recess the conductor and liner materials below the surface 131. The etch is, for example, selective to the dielectric layer to effectively etch the conductive material without etching the dielectric layer. The recess provides a region in which a liner material is provided to encapsulate the contact. Typically, the recess is about equal to the thickness of the liner 137. Depending on the etch efficiency, the recess may include an additional depth that takes into account materials removed by the subsequent polishing step. A liner layer 139 is deposited on the surface 131, filling the recess. As shown in FIG. 1e, the liner 139 is polished by, for example, CMP to provide a planar surface. The polish produces a contact 140 that is encapsulated by liner 142.

Figure 1F:
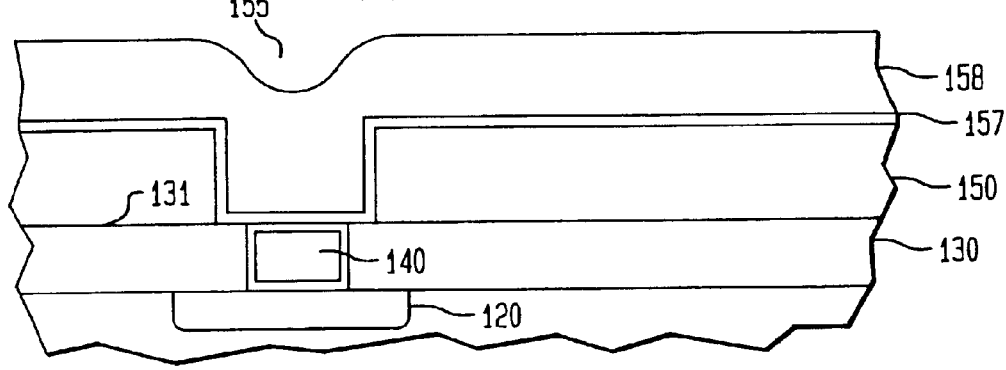

Referring to FIG. 1f, a dielectric layer 150 is deposited over surface 131 and patterned to form a trench 155 therein. Patterning of the trench is achieved by conventional techniques which includes masking and etching, such as RIE. The location of the trench corresponds to where a conductor is to be formed. The trench is aligned with contact 140, providing an electrical connection between the conductor and device layer 120.

The dimensions of the trench correspond to the cross section of the conductor, which is determined by design parameters such as sheet resistance. Lower sheet resistance is desirable as it improves performance of the IC. The greater the area of the cross-section, the lower the sheet resistance. The height (thickness) and width of the cross-section can be varied to result in a conductor that does not exceed a specified sheet resistance. The width of the conductor is limited by lithographic ground rule (GR). For GR of 0.25 μm with 0.5 μm pitch, typical thickness of the conductor is about 3700 Å.

In accordance with the invention, a liner 157 is deposited over the dielectric layer 150, covering the surface dielectric layer and lining the trench sidewalls and bottom. The liner 157 is deposited over the insulator layer 150. The liner facilitates an enhanced grain-orientation randomness in the conductive material that fills the trench. The layer comprises a material with low-oriented grains and/or amorphous character such as, for example, titanium nitride (TiN). Refractory materials or other materials such as carbon, graphite, noble and near noble metals, rare earth metals, or other materials which have a random grain orientation and/or amorphous character are also useful. The liner is deposited by CVD or PVD under process conditions which cause the deposited film to have an enhanced grain orientation randomness and/or amorphous character.

The thickness of the liner is sufficient to effect a random grain orientation in the subsequently deposited conductor material to increase its electromigration lifetime. Typically, the liner thickness, for TiN, is about 5–1000 Å, and preferably about 10–100 Å. The thickness may be varied depending on, for example, sheet resistance requirements and may be optimized for specific applications.

A subliner layer (not shown) may be formed prior to the formation of the liner layer 157. This subliner layer serves as, for example, an adhesion layer which improves the contact resistance between layers and to provide a template for the subsequently deposited liner to nucleate and grow. In one embodiment, the subliner layer comprises, for example, titanium (Ti). Various techniques for depositing the Ti layer, such as CVD, PVD and I-PVD are useful. The thickness of the Ti layer is typically about 5–1000 Å, and preferably about 10–100 Å.

A conductive layer 158 is deposited over the liner 157. The conductive layer, for example, comprises Al, Cu, or W. Other conductive materials are also useful. Typically, the conductive layer is deposited by conventional techniques. Such techniques include, for example, CVD, PVD and I-PVD. Other techniques for depositing the conductive layer are also useful. To ensure that the conductive material fills the trench structure, an overfill is typically employed.

Figure 1G:
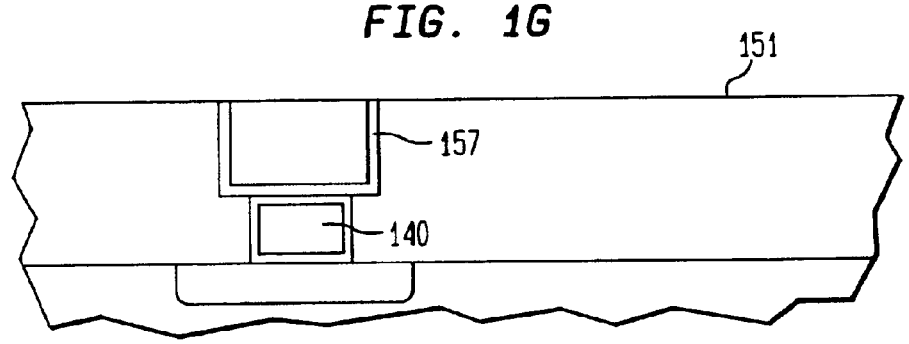

Referring to FIG. 1g, the wafer surface is then planarized by CMP using, for example, the dielectric layer as an etch stop. As a result, the CMP removes excess liner and conductor materials from the surface of the dielectric layer, producing a planar top surface 151. The conductor formed has its sidewalls and bottom lined with a liner.

Figure 1H:
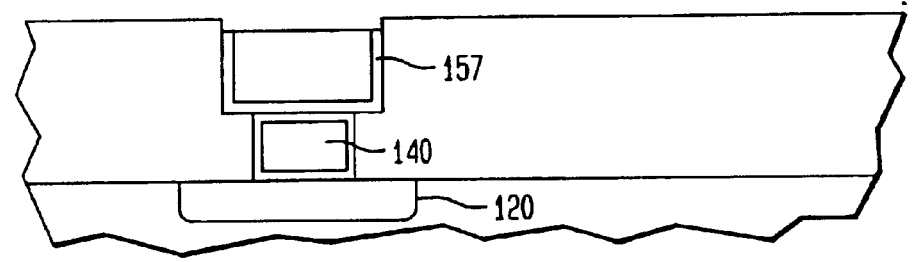

Referring to FIG. 1h, an etch such as a CMP is optionally employed to further recess the conductor and liner materials below the surface 151. The recess provides a region in which a liner material is provided to encapsulate the contact. Typically, the recess is about equal to the thickness of the liner 157. Depending on the polishing efficiency, the recess may include an additional depth that takes into account materials removed by the subsequent polishing step.

Figure 1I:
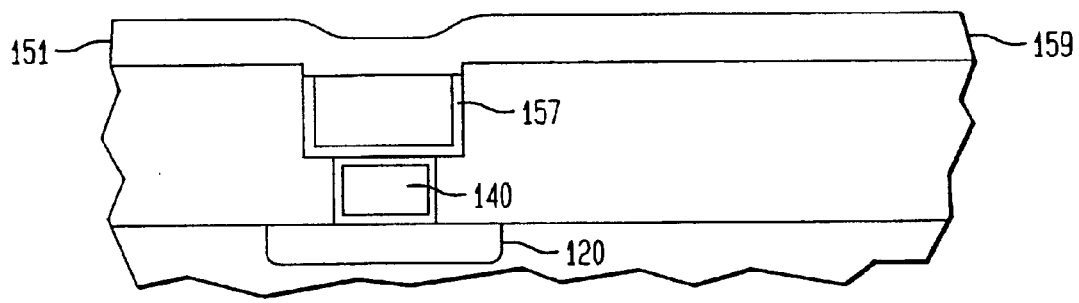
Figure 1J:
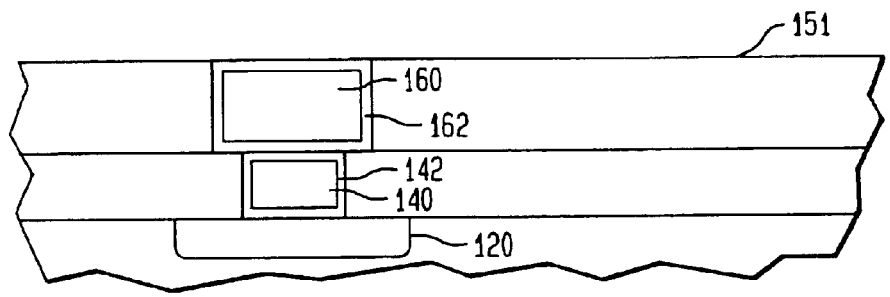

As shown in FIG. 1i, a liner layer 159 is deposited on the surface 151, filling the recess. Referring to FIG. 1j, the liner 159 is polished by CMP, resulting in a conductor 160 encapsulated by liner 162 and a planar surface 151 for further processing. The polish produces an electrical connecting between conductor 160 and device layer 120. By encapsulating the conductor with a liner that causes the conductor material to have a random grain orientation, improved conductor reliability is achieved.

Referring to FIG. 2, an insulator layer 230 is formed over a substrate 201, covering device features and a device layer 220. The insulator layer serves, for example, as an interlevel dielectric that isolates the device features from a conductive layer. The insulator layer comprises a dielectric material such as $SiO_2$, PSG, BPSG, or other dielectric materials. Typical thicknesses of the insulator layer is about 0.9 to 2.0 microns thick. To provide a planar top surface 131, the insulator layer is typically planarized.

The insulator layer is patterned to provide a dual damascene structure 245 therein. Such dual damascene structure is formed using conventional techniques such as those described in Licata et al., VLSI Multilayer Interconnection Conf. Proceedings (1995); and Edelstein et al., 1997 IEDM conference, which are herein incorporated by reference for all purposes. Illustratively, the dual damascene structure includes a trench portion 242 and a via portion 244. The trench represents, for example, an overlying metallization layer that is to be contacted to underlying device layer 220 with the via. The overlying metallization, for example, is a conductive line. Other dual damascene structures representing conductive lines are located over other defined regions with which electrical contact is desired. The depth and width of the trench portions and via portions depend on the design parameters, such as sheet resistance and materials used.

Figure 2A:
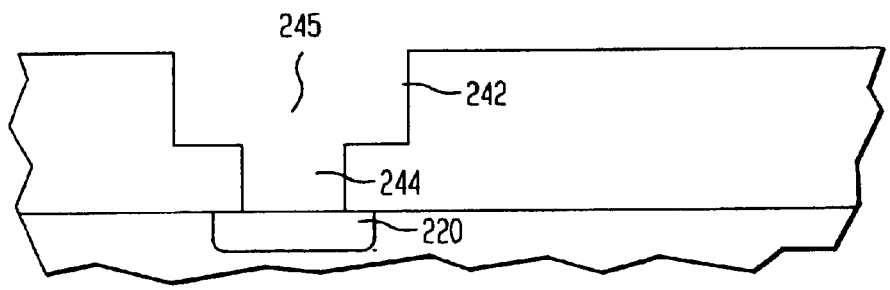
FIGS. 2a–2f show an alternative embodiment of the invention.
Figure 2B:
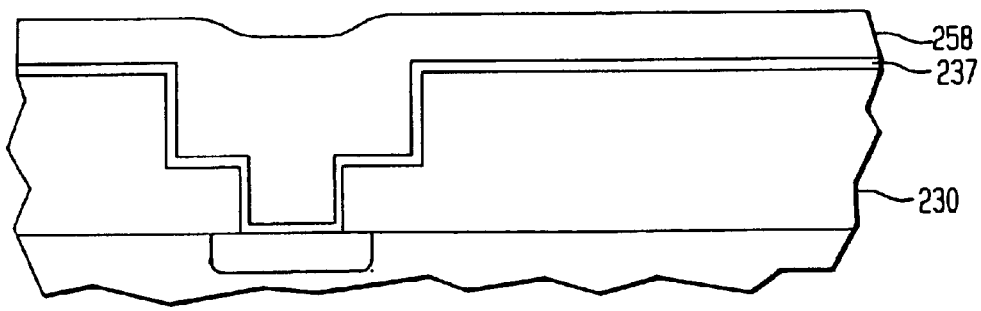

Referring to FIG. 2b, a liner 237 is deposited over the insulator layer 230, lining the surface of the dielectric layer and the trench and via portions of the damascene structure. The liner layer 237 is similar to liner layer 137 or 157 earlier described. The liner, imparts an enhanced grain-orientation randomness in the material that fills the damascene structure, comprises a material having low-oriented grains and/or amorphous character. Such materials include, for example, TiN, carbon, graphite, noble, near noble metals, rare earth metals, refractory materials, or other materials that have a random grain orientation and/or amorphous character.

In one embodiment, the liner comprises TiN deposited by, for example, CVD or PVD under process conditions which results in the liner having enhanced grain orientation randomness and/or amorphous character. Other techniques for depositing the liner that enhances the grain orientation randomness and/or amorphous character of the material are also useful. Optionally, a subliner layer (not shown) is provided under liner 237 to serve as an adhesion layer which improves the contact resistance between layers and to provide a template for the subsequently deposited TiN film to nucleate and grow. Materials such as Ti are useful to form the subliner layer.

A conductive layer 258 is deposited by, for example CVD, PVD, I-PVD, or other techniques after the formation of the underlying layer 320. The conductive layer, for example, comprises Al, Cu, or W. Other conductive materials are also useful. To ensure that the conductive material fills the damascene structure, an overfill is typically employed.

Figure 2C:
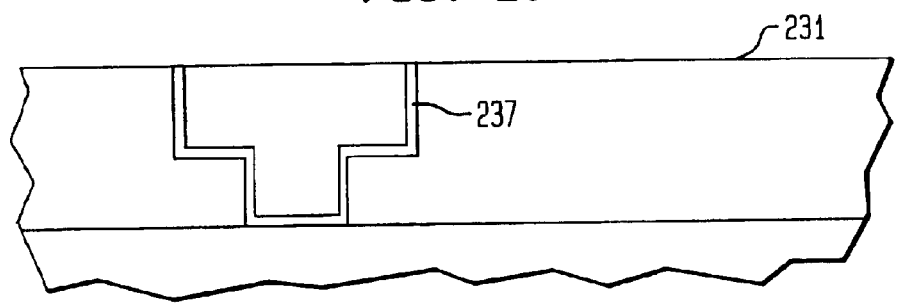

As shown in FIG. 2c, excess material from liner 237 and conductor 258 are then polished to provide a planar surface 231. Polishing is accomplished by, for example, a chemical mechanical polish (CMP) using the dielectric layer 130 as polish stop. The liner and conductor materials are removed from the surface of the dielectric layer, producing a planar surface 231 and a damascene structure having liner 237 lining its inner walls. The liner, as described causes the conductive material in the damascene structure to have a random grain orientation, thereby improving its electomigration lifetime.

Figure 2D:
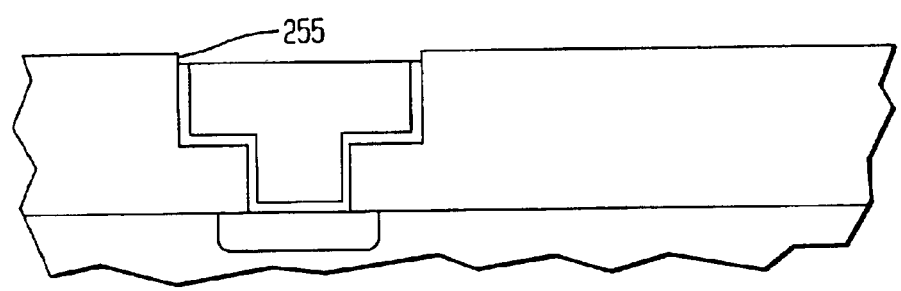

Referring to FIG. 2d, the surface of the damascene structure is etched, recessing the conductive material and liner below surface 251. The recess provides a region 255 in which a liner material is provided to encapsulate the dual damascene structure with the liner in accordance with the invention. Typically, the recess is about equal to the thickness of the liner 237. Depending on the polishing efficiency, the recess may include an additional depth that due to materials removed by the subsequent polishing step.

Figure 2E:
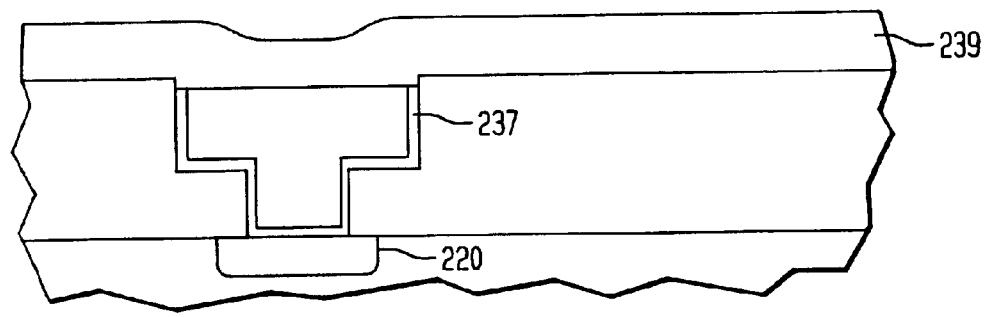
Figure 2F:
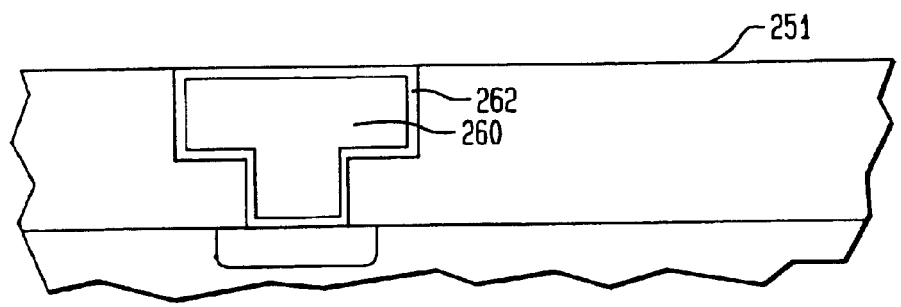

As shown in FIG. 2e, a liner layer 239 is deposited on the surface, filling the recess. Referring to FIG. 2f, the liner 159 is polished by CMP, resulting in a dual damascene structure 260 encapsulated by liner 262 and a planar surface 251 for further processing. By encapsulating the dual damascene structure with a liner that causes the conductor material to have a random grain orientation, improved reliability is achieved.

In some embodiments, the conductive layer 158 of FIG. 1 or 258 of FIG. 2 may comprise a plurality of layers, forming a film stack. The use of a film stack improves reflow and wettability. The film stack, for example, comprises CVD Al and PVD Al. The CVD Al conformally coverage of Al on the trench sidewalls and trench bottom. The CVD Al insures that the high temperature PVD Al film can wet the surface and flow into the aspect ratio features without closing off. For example, the conductive layer may comprise a combination of Al and Al-alloy films. Other combinations of conductive materials, which include Cu, Au, Ag, Ni, Pt, Pd, V, Nb, W, Ta, Ti, and their alloys such as CuAl, $CuAg_3$, TaN and the like, are also useful. Examples of different types of film stacks are listed in Table 1.

TABLE 1

Sputtered Ti/CVD TiN/CVD Al/PVD Al
sputtered Ti/CVD TiN/CVD CU/PVD Cu
CVD TiN/CVD Al/PVD Al
CVD TiN/CVD Cu/PVD Cu
sputtered Ti/CVD TiN/CVD Al/PVD Al/high pressure and temperature
sputtered Ti/CVD TiN/CVD Cu/PVD Cu/high pressure and temperature
CVD TiN/CVD Al/PVD Al/high pressure and temperature
CVD TiN/CVD Cu/PVD Cu/high pressure and temperature Although the invention has been described with reference to the above illustrative embodiments with a certain degree of particularity, changes and variations are possible therein and will be apparent to those skilled in the art after reading the foregoing description. It is therefore to be understood that the present invention may be presented otherwise than as specifically described herein without departing form the spirit and scope thereof.

What is claimed is:

1. An integrated circuit comprising:
   a dielectric layer formed over a substrate;
   a first damascene structure in the dielectric layer, the first damascene structure comprising a bottom surface and first and second sidewalls;
   a first conductor located in the damascene structure, the conductor comprising a conductive material having a random grain orientation;
   a first liner layer lining the bottom surface and sidewalls of the first damascene structure and encapsulating the first conductor by contacting a top surface of the first conductor, wherein the first liner layer imparts the random grain orientation in the conductive material of the first conductor to improve electromigration lifetime of the first conductor;
   a second damascene structure in the dielectric layer, the second damascene structure comprising a bottom surface and second sidewalls and disposed above said first damascene structure;
   a second conductor located in the damascene structure, the conductor comprising a conductive material having a random grain orientation;
   a second liner layer lining the bottom surface and sidewalls of the second damascene structure and encapsulating the second conductor by contacting a top surface of the second conductor, wherein the second liner layer imparts the random grain orientation in the conductive material of the second conductor to improve electromigration lifetime of the second conductor; and
   wherein said second liner layer is in contact with said first liner layer.

2. An integrated circuit of claim 1, wherein a conductive material of the first and second liners comprises a random grain orientation.

3. An integrated circuit of claim 1, wherein a conductive material of the first and second liners comprises an amorphous character.

4. An integrated circuit of claim 1, wherein a conductive material of the first and second liners is chosen from a group consisting essentially of titanium nitride, tantalum and tantalum nitride.

5. An integrated circuit of claim 4, wherein a conductive material of the first and second liners comprises a random grain orientation or amorphous character.

6. An integrated circuit of claim 1, wherein the liner comprises a layer of titanium nitride, the layer being between about 10 Angstroms and about 1000 Angstroms thick.

7. An integrated circuit of claim 6, wherein the layer of titanium nitride is about 50 Angstroms thick.

8. An integrated circuit of claim 7, wherein the layer of titanium nitride is a layer of $N_2/H_2$ plasma treated titanium nitride.

9. An integrated circuit of claim 1, further comprising a subliner.

10. An integrated circuit of claim 9, wherein the subliner is a layer of titanium.

11. An integrated circuit of claim 10, wherein the layer of titanium for the subliner is between about 10 Angstroms and about 300 Angstroms thick.

12. An integrated circuit of claim 1, wherein the conductive materials of the first and second conductors comprise at least one material chosen from the group consisting essentially of aluminum, copper and tungsten.

13. An integrated circuit of claim 12, further comprising a subliner comprising titanium.

14. An integrated circuit of claim of claim 13, wherein the conductor has a thickness of about 3700 Angstroms.

15. An integrated circuit comprising:
   a conductor comprising a conductive material having a random grain orientation, the conductor forming device interconnections having a damascene structure; and
   a liner surrounding at least three surfaces of the conductor, wherein the liner is amorphous and wherein the liner imparts the random grain orientation in the conductive material of the conductor to improve the electromigration lifetime of the conductor.

16. An integrated circuit of claim 15, wherein the conductor is aluminum.

17. An integrated circuit of claim 16, wherein the liner comprises titanium nitride.

* * * * *